US010705580B2

(12) United States Patent
Gross et al.

(10) Patent No.: US 10,705,580 B2
(45) Date of Patent: Jul. 7, 2020

(54) INTELLIGENT ENERGY-OPTIMIZATION TECHNIQUE FOR COMPUTER DATACENTERS

(71) Applicant: Oracle International Corporation, Redwood Shores, CA (US)

(72) Inventors: Kenny C. Gross, Escondido, CA (US); Kalyanaraman Vaidyanathan, San Diego, CA (US); Sanjeev Sondur, Horsham, PA (US)

(73) Assignee: Oracle International Corporation, Redwood Shores, CA (US)

( * ) Notice: Subject to any disclaimer, the term of this patent is extended or adjusted under 35 U.S.C. 154(b) by 193 days.

(21) Appl. No.: 15/247,264

(22) Filed: Aug. 25, 2016

(65) Prior Publication Data

US 2018/0059745 A1    Mar. 1, 2018

(51) Int. Cl.
*G06F 1/20* (2006.01)
*H05K 7/20* (2006.01)

(52) U.S. Cl.
CPC ......... *G06F 1/206* (2013.01); *H05K 7/20836* (2013.01); *Y02D 10/16* (2018.01)

(58) Field of Classification Search
CPC .......................... G06F 1/206; H05K 7/20836
See application file for complete search history.

(56) References Cited

U.S. PATENT DOCUMENTS

| 7,869,965 | B2 | 1/2011 | Gross et al. |
| 8,108,697 | B2 | 1/2012 | Ho et al. |
| 8,214,682 | B2 | 7/2012 | Vaidyanathan et al. |
| 2002/0109621 | A1* | 8/2002 | Khair .................. A61B 5/0006 341/174 |
| 2007/0124574 | A1* | 5/2007 | Goldberg ................ G06F 1/206 713/100 |
| 2009/0210096 | A1* | 8/2009 | Stack ....................... F24F 11/30 700/278 |
| 2010/0131120 | A1* | 5/2010 | Lewis ..................... G05D 23/19 700/300 |
| 2010/0296383 | A1* | 11/2010 | Gross ................... G11B 19/042 369/247.1 |
| 2011/0258157 | A1* | 10/2011 | Vaidyanathan .......... G01C 5/00 706/54 |
| 2012/0185711 | A1* | 7/2012 | Parker .................... G06F 1/203 713/320 |

(Continued)

*Primary Examiner* — Thomas C Lee
*Assistant Examiner* — Michael Tang
(74) *Attorney, Agent, or Firm* — Park, Vaughan, Fleming & Dowler LLP

(57) ABSTRACT

The disclosed embodiments relate to a system that controls cooling in a computer system. During operation, this system monitors a temperature of one or more components in the computer system. Next, the system determines a thermal-headroom margin for each of the one or more components in the computer system by subtracting the temperature of the component from a pre-specified maximum operating temperature of the component. Then, the system controls a cooling system that regulates an ambient air temperature for the computer system based on the determined thermal-headroom margins for the one or more components. In some embodiments, controlling the cooling system additionally involves minimizing a collective energy consumption of the computer system and the cooling system.

14 Claims, 8 Drawing Sheets

(56) References Cited

U.S. PATENT DOCUMENTS

| | | | |
|---|---|---|---|
| 2013/0090889 A1* | 4/2013 | Vaidyanathan | G01K 1/024 |
| | | | 702/136 |
| 2013/0158713 A1* | 6/2013 | Geissler | G05D 23/1932 |
| | | | 700/275 |
| 2014/0361092 A1* | 12/2014 | Iizuka | G06F 1/206 |
| | | | 236/49.3 |

* cited by examiner

INTELLIGENT ENERGY-OPTIMIZATION TECHNIQUE FOR COMPUTER DATACENTERS

BACKGROUND

Field

The disclosed embodiments generally relate to techniques for optimizing energy efficiency in computer datacenters. More specifically, the disclosed embodiments relate to a technique for optimizing energy efficiency by intelligently controlling cooling mechanisms in computer datacenters.

Related Art

Excessive heat can cause reliability problems in computer datacenters. To prevent such problems, every datacenter in the world presently maintains a Computer Room Air Conditioner (CRAC) system, which delivers a desired target ambient temperature at the inlet grilles of servers and storage assets within the datacenter. This target ambient temperature is established based on worst-case assumptions provided by the server vendors. This is because server vendors have no way of knowing ahead of time about the workload demands or the altitude of the customer's datacenter in which their servers will ultimately be deployed. Consequently, cooling systems in datacenters are designed very conservatively, so that if a cooling system provides inlet cooling air within a normal ambient-temperature range (e.g., 15° C. to 35° C.), every component inside the servers and associated storage assets will operate safely, even if the datacenter is executing an extremely high-demand workload and is located at a high altitude where the air is thinner and has less cooling capability. Unfortunately, this overly conservative design of datacenter cooling systems based on worst-case assumptions wastes a significant amount of energy because the servers and storage assets that are not running maximal workloads in datacenters at high altitudes are cooled more than necessary.

Existing datacenter thermal-control systems do not have visibility into the thermal dynamics and energy dynamics inside the server assets. As such, the ambient temperatures in datacenters are presently controlled without any insight into substantial energy wastage mechanisms that exist inside enterprise server and storage assets. These parasitic energy-wastage mechanisms include the following:

(1) Nonlinear power draw from the server fan motors—In most enterprise servers, fan motors use more power than CPUs, and the aggregate fan motor power increases cubically with fan RPMs;

(2) Nonlinear leakage power inside the CPU chips—Leakage power is completely wasted (does not help with computing), and increases exponentially with chip temperature; and (3) Energy wastage due to ambient vibrations in the servers—These vibrations are caused by a number of sources, including internal fans and blowers, metal racks housing the servers and flow-induced vibrations from fluid and fluid/air chillers.

Note that these energy wastage mechanisms are present in the newest and most energy-efficient datacenters. Also, the heat generated by these parasitic wastage mechanisms imposes a double penalty on the datacenter owner, who pays once for the wasted power, and then pays again to remove the resulting wasted heat from the datacenter.

Hence, what is needed is a technique for cooling computational resources within a datacenter, without the above-described drawbacks of existing cooling techniques.

SUMMARY

The disclosed embodiments relate to a system that controls cooling in a computer system. During operation, this system monitors a temperature of one or more components in the computer system. Next, the system determines a thermal-headroom margin for each of the one or more components in the computer system by subtracting the temperature of the component from a pre-specified maximum operating temperature of the component. Then, the system controls a cooling system that regulates an ambient air temperature for the computer system based on the determined thermal-headroom margins for the one or more components.

In some embodiments, controlling the cooling system based on the thermal-headroom margins involves controlling the ambient air temperature to ensure that the thermal-headroom margins for each of the one or more monitored components does not fall below a minimum thermal-headroom margin.

In some embodiments, controlling the cooling system additionally involves minimizing a collective energy consumption of the computer system and the cooling system.

In some embodiments, minimizing the collective energy consumption involves controlling a fan speed of the cooling system to balance a power consumption of the cooling system, which grows nonlinearly with increasing fan speeds, against a power drain from leakage currents in semiconductor chips in the computer system, which grows nonlinearly as decreasing fan speeds cause temperatures of the semiconductor chips to increase.

In some embodiments, balancing the power consumption additionally involves balancing a power drain due to ambient vibrations in the computer system, wherein increasing fan speeds cause the ambient vibrations to increase.

In some embodiments, controlling the cooling system involves using a closed-loop control system to control the cooling system to cause temperatures of the one or more components in the computer system to meet a target temperature.

In some embodiments, the cooling system comprises one or more of the following: an air-conditioning system that controls an ambient air temperature for the computer system; and one or more cooling fans in the computer system, which blow the ambient air across the one or more components in the computer system.

In some embodiments, monitoring the temperature of one or more components in the computer system involves collecting telemetry signals from sensors in the computer system, wherein the telemetry signals include temperature measurements from the one or more components.

In some embodiments, the system processes the telemetry signals by performing one or more of the following operations: (1) performing analytic dequantization operations on the telemetry signals to obtain high-resolution dequantized signals from low-resolution sensor signals; (2) synchronizing the telemetry signals with respect to a uniform time base; and (3) validating the telemetry signals to ensure the telemetry signals are obtained from properly operating sensors.

In some embodiments, the one or more monitored components in the computer system include one or more of the

DETAILED DESCRIPTION

Figure 1A:
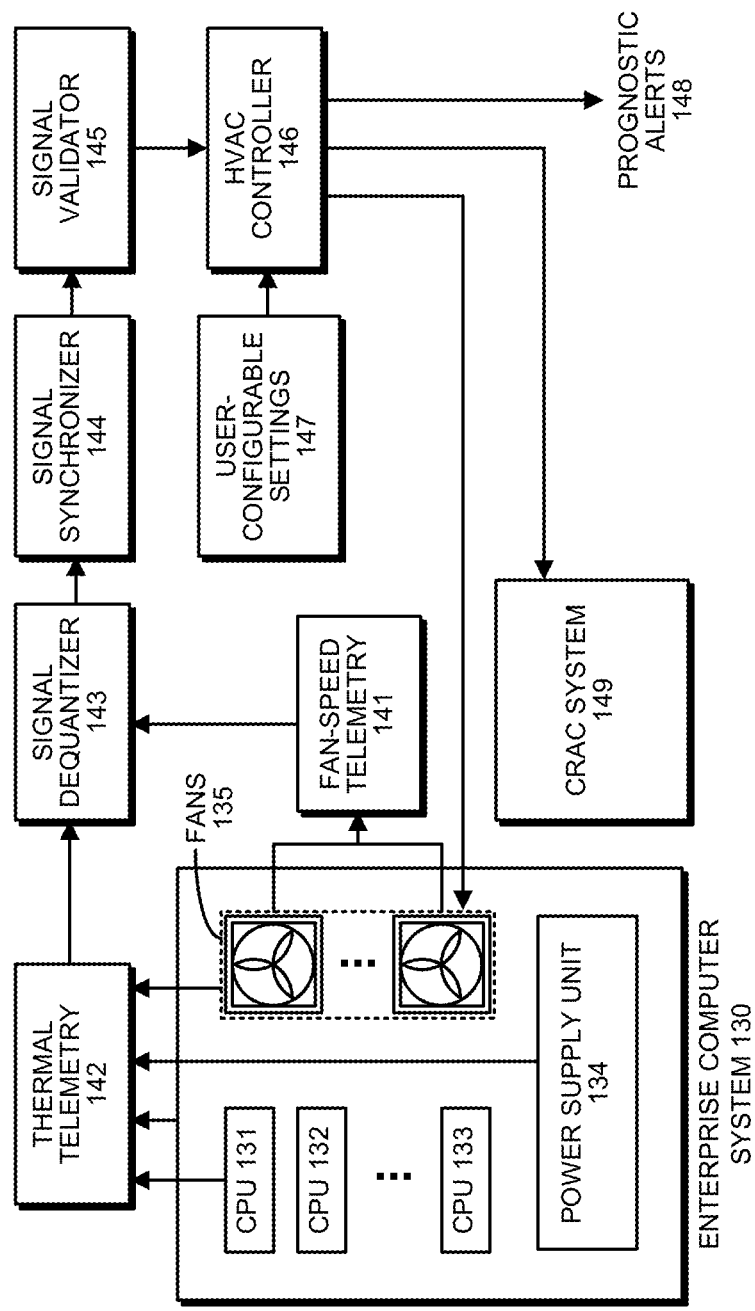
FIG. 1A illustrates a cooling system for an enterprise computer system in accordance with the disclosed embodiments.

The following description is presented to enable any person skilled in the art to make and use the present embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present embodiments. Thus, the present embodiments are not limited to the embodiments shown, but are to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Overview

The disclosed embodiments seamlessly integrate Intelligent Power Monitoring (IPM) telemetry with a heating, ventilation, and air conditioning (HVAC) controller to operate datacenter CRACs (Computer Room Air Conditioners) in a manner that intelligently manages power consumption from the chip level through the server/rack level, and also accounts for power usage of the HVAC system itself. The resulting CPU-to-CRAC intelligent real-time power optimization system minimizes large, nonlinear, energy-wastage mechanisms inside the datacenter.

This new Intelligent Datacenter Energy Optimization (iDCEO) concept is integrated with three signal-conditioning and signal-analysis techniques (namely, signal dequantization, signal coherence optimization, and sensor operability validation) to achieve global energy optimization across the datacenter. As the computers in the datacenter warm up and cool down, the AC systems increase and decrease their cold air output to optimize the interplay among three parasitic wastage mechanisms in the servers: (1) leakage power in the CPU chips, (2) motor power for the internal fans and blowers, and (3) vibrational degradation of I/O performance and associated energy loss.

Note that existing enterprise computing systems are managed over-conservatively with respect to how thermal-headroom margins (THMs) are controlled for the server assets. (The THM for a component in a computer system is defined as the difference between the maximum allowable temperature for the component and the actual real-time temperature for the component during system operation.) THMs are managed conservatively to ensure there will be sufficient cooling under worst-case scenarios. For example a worst-case scenario can assume: (1) the server has a maximum internal configuration (maximum number of CPUs, all memory slots full, maximum number of disk drives and I/O cards); (2) the customer is running the maximum possible workload for the CPUs, the memory, and the I/O system; and (3) the datacenter is located at a high altitude, where the air is thinner and has less cooling capability.

The reason that THMs are presently managed over-conservatively is that 99% of the server assets in the world do not meet the above-listed conservative assumptions. For 99% of the servers in the world that run normal workloads in datacenters located at low altitudes with normal ambient temperatures, we routinely see THM values of 30-40° C. Moreover, for customers with diurnal workload demands that drop to less than 5% at night or during weekends, the THM values can exceed 50° C. Hence, the overly conservative thermal management techniques used in most datacenters constitute a huge opportunity for energy savings.

The embodiments described below achieve significant energy savings by "closing the loop" between the HVAC controllers and comprehensive, accurate, internal system telemetry. This makes it possible to safely collapse the overly large and wasteful THM values for most datacenters, which are not located at high altitudes and are running realistic customer workloads.

Challenges Related to Obtaining Sensor Data

A number of challenges must be addressed in order to effectively communicate thermal and power information contained in sensor data obtained from computational assets directly into CRAC controllers. These challenges make it impractical to use a naïve solution that simply runs temperature and power information obtained from sensors in the computational assets directly into the CRAC controllers.

In particular, sensor reliability is a significant challenge. One cannot tie internal thermal/power measurements directly to CRAC controllers because the inexpensive sensors used throughout enterprise computer systems are fallible and can degrade in service and/or drift out of calibration. If CRAC controllers take improper actions due to degraded internal sensors, this potentially jeopardizes the expensive computational assets. To remedy this problem, the disclosed embodiments use advanced pattern-recognition techniques (described below) to facilitate continuous signal validation and sensor operability validation so that only highly accurate validated signals are used as actuator signals for the CRAC controllers.

Low-resolution sensor signals provide another challenge. Enterprise computer systems presently use low-resolution analog-to-digital converters, typically with only 8-bit resolution, to measure physical parameters, including temperatures, voltages, currents, power, and fan speeds. The resulting low-resolution digitized signals are highly "quantized," and it is impractical to use such highly quantized signals in closed-loop feedback-control systems, because the highly quantized signals cause jitter, instability and inefficient operation. To remedy this problem, the disclosed embodiments use an "analytical dequantization" technique (described below), which yields high-resolution dequantized signals from low-resolution sensor signals.

The lack of synchronization between sensor signals presents another challenge. Sensor signals obtained from computing assets are often substantially out of synchrony with one another. The reason that it is challenging to synchronize telemetry signals (not only among multiple servers in the datacenter, but even inside the individual servers) is that enterprise servers presently use multiple internal clocks. Some of these internal clocks are hardware clocks, which run on batteries, and batteries eventually degrade in service and die. Other internal clocks are "software" clocks, which derive their timing from computer chips. As a consequence, these software clocks speed up or slow down as the computational burden on the computer chips decreases or increases. Moreover, both hardware clocks and software clocks are set by humans at some point in time, so they also have variations caused by human error. To remedy this problem, the disclosed embodiments use an analytical telemetry phase-synchronization technique (described below) to derive accurate and reliable THM metrics, which are used to control actuators for the CRAC systems.

Challenges Related to Minimizing Energy Consumption

Even after the above-described challenges for obtaining sensor data have been addressed, and accurate and valid sensor data is obtained for the CRAC controller, it is challenging for the CRAC controller to optimize power consumption in the computer system. As mentioned above, these challenges arise from the nonlinear behavior of three parasitic energy wastage mechanisms in the servers, namely: (1) leakage power in the CPU chips; (2) motor power for the internal fans and blowers; and (3) vibrational degradation of I/O performance and associated energy loss.

We first describe the nonlinear behavior of leakage power. The power dissipated by modern computer chips comprises two components: switching power and leakage power. Up until just a few years ago, enterprise computing chips consumed power mainly for switching purposes related to flipping gates as computations are performed. Leakage power, which is considered wasted power because it is not used for computations, has traditionally been negligible. However, in current-generation enterprise servers, because of the relentless miniaturization of semiconductor circuits, leakage power has become increasingly significant, using up to 40% of the power budget for current-generation servers, and is projected to grow in future generations of servers. Note that this leakage power increases exponentially with the temperature of the CPU chips. Consequently, when the ambient temperature is cool enough to keep the CPU chips lower than the threshold for leakage power, essentially all of the power consumed by the CPU chips is used to execute the customer's computational workload. However, as soon as the ambient temperature rises to the point where the CPU chips enter the "leakage zone," the leakage power becomes significant, and continues to grow exponentially with further increases in ambient temperature.

We next describe the nonlinear power consumption of fan motors. To cope with ever-increasing heat generated by servers, fan motors inside the servers have become increasingly more powerful and numerous. Even the smallest servers in the datacenters now incorporate multiple fans, and larger servers have larger numbers of fans. Also, internal power supplies in servers are equipped with internal fans, and each server contains multiple power supplies. Therefore, it is not uncommon for larger servers to have 15-20 fans. As a consequence, for most enterprise servers, the aggregate fan motor power is greater than the total CPU power. Moreover, fan motor power increases with the cubic power of the fan RPMs. Hence, if the fan RPMs double, which is well within their operational range, the fan motor power goes up by a factor of eight. This means that as internal computing workloads go up, and the temperature of ambient inlet air rises, the server fans consume larger amounts of additional power, and this power does not contribute to completing the customer's computational tasks. Also, the fan motors generate additional heat, which the CRAC units must remove from the datacenter.

We now describe how vibrations inside an enterprise computer system can degrade I/O performance. For commodity hard disk drives (HDDs), areal densities have been growing exponentially, at a rate faster than Moore's law. The write head on HDDs is now trying to hit a tiny track that is only 20 nanometers wide, while floating just 7 nanometers above the surface of a platter that is spinning at up to 15,000 RPMs. Because of these extremely small dimensions, low-level vibrations inside storage servers/arrays can significantly degrade I/O throughput. This is a problem because the increasing use of fans inside enterprise computer systems is causing the level of vibrations to rise. As mentioned above, the fans in each new generation of server systems are more numerous and powerful in order to cope with increasing amounts of heat generated by smaller circuits. Moreover, as servers are deployed in metal racks with other servers that also have internal fans, ambient vibrations throughout the rack rise.

Figure 6:
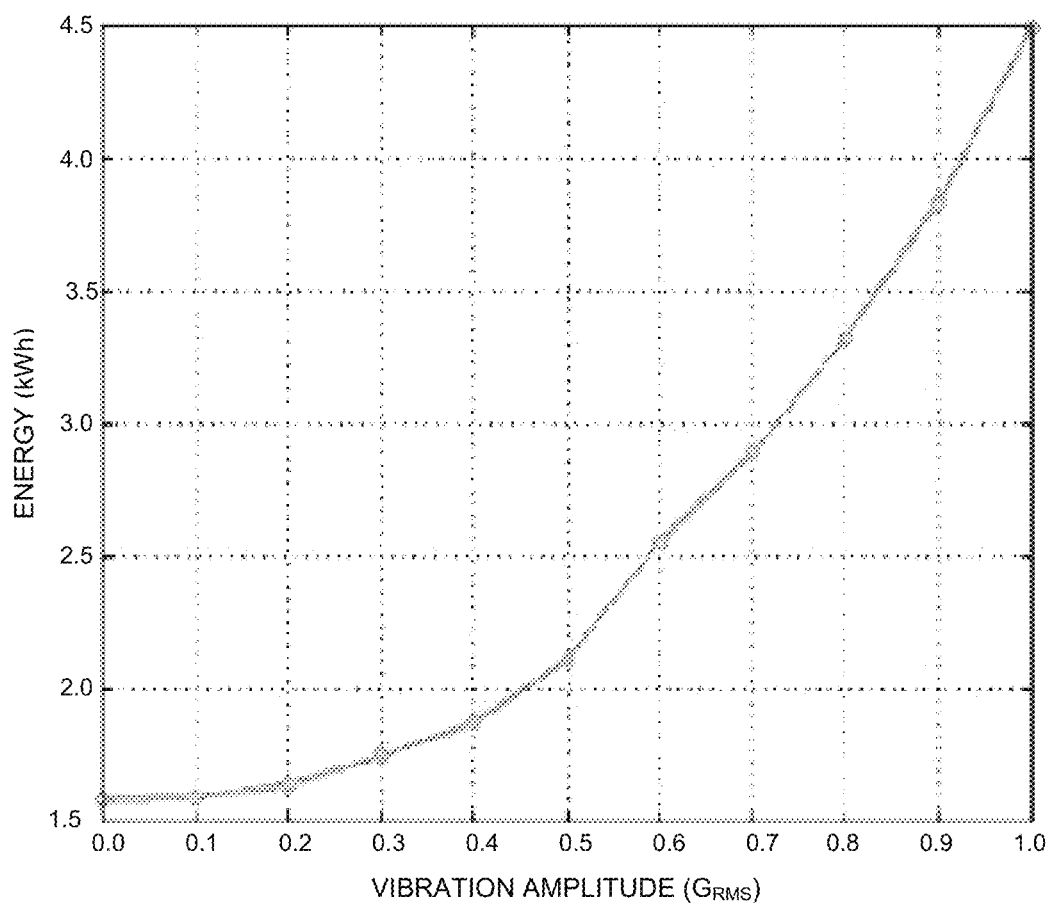
FIG. 6 illustrates how vibrations affect energy usage for an I/O-intensive application in accordance with the disclosed embodiments.

These ambient vibrations can significantly reduce system performance when servers are running I/O-intensive workloads, which include important enterprise applications, such as applications that facilitate: online transaction processing (OLTP), data warehousing, web serving, video streaming, customer-relationship management (CRM), and enterprise resource planning (ERP). Hence, because of the extreme sensitivity of present-generation HDDs to low-level vibrations, the total integrated power needed to complete a fixed customer workload (e.g., updating a multi-terabyte database) goes up as the ambient vibration levels go up. For example, if I/O performance degrades by 20% due to elevated ambient vibrations for a server in a metal rack with other servers, then it can take 25% longer for the customer workload to complete. This means that all the components inside the server (e.g., fan motors, memory, HDDs, ASICs, I/O cards, and PSUs) are consuming power for 25% longer. As an example, the graph in FIG. 6 presents empirical results showing how much energy is consumed while updating a 10 terabyte database for different levels of vibrational amplitude measured as root mean square acceleration $G_{RMS}$. Note that energy consumption increases by almost three times as $G_{RMS}$ increases.

Because of the foregoing nonlinear processes taking place inside enterprise computing systems, there is a three-way relationship among ambient air temperature outside the server, fan motor power, and CPU leakage power. By integrating Intelligent Power Monitoring telemetry from inside the servers with the CRAC controls outside the servers, we are now able to continuously "seek and settle" at the minimum of the "V-shaped" power function. On one side of the "V" is the cubic relationship between fan speed and power. On the other side of the "V" is the exponential relationship between chip temperature and leakage power. The resulting CPU-to-CRAC thermal-aware and energy-aware real-time power-optimization technique minimizes energy consumption in the presence of the large, nonlinear energy wastage mechanisms inside the datacenter assets, thereby achieving global energy optimization across the datacenter.

Figure 7:
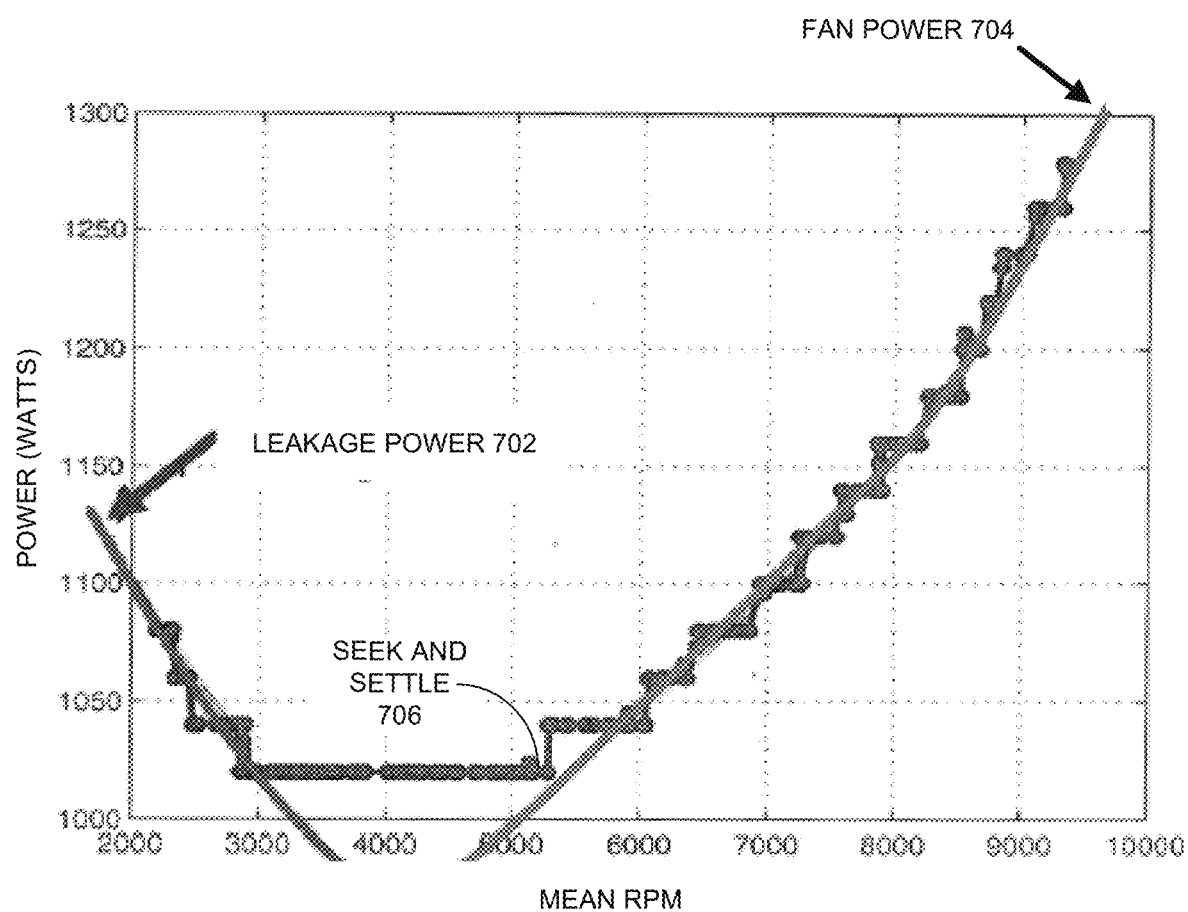
FIG. 7 illustrates how fan speed can be adjusted to balance fan power against leakage power in accordance with the disclosed embodiments.

For example, FIG. 7 presents a graph that illustrates how power consumption varies with fan speed. On the left-hand side of the graph, leakage power 702 increases with decreasing fan speeds. On the right-hand side of the graph, fan power 704 increases with increasing fan speed. The operating point line 706 in the graph illustrates how the system "seeks and settles" into the minimum of this V-shaped energy function.

We next describe details of an exemplary cooling system for an enterprise computer system.

Cooling System

FIG. 1A illustrates a cooling system for an enterprise computer system 130 in accordance with the disclosed embodiments. As illustrated in FIG. 1A, enterprise computer system 130 includes a number of CPUs 131-133 and a power supply unit (PSU) 134. In addition, enterprise computer system 130 includes a number of fans 135, which are used to blow ambient air across CPUs 131-133 and PSU 134 to keep these components cool. Note that enterprise computer system 130 can also include storage units, such as HDDs, which are not shown.

During operation of enterprise computing system 130, a thermal-telemetry unit 142 gathers telemetry data from components inside enterprise computing system 130, including CPUs 131-133, PSU 134 and fans 135. At the same time, fan-speed telemetry unit 141 gathers fan-speed telemetry data. The telemetry data obtained by both thermal telemetry unit 142 and fan-speed telemetry unit 141 feeds into a signal dequantizer 143, which performs analytic dequantization operations on the telemetry signals to obtain high-resolution dequantized signals from low-resolution sensor signals. For example, to perform these dequantization operations, signal dequantizer 143 can use the technique described in U.S. Pat. No. 7,248,980, entitled "Method and Apparatus for Removing Quantization Effects in a Quantized Signal," by inventors Kenny C. Gross, et. al., filed on 27 Jan. 2006 and issued on 24 Jul. 2007. This patent is hereby incorporated by reference in order to disclose details of this technique.

Next, the dequantized telemetry signals feed into a signal synchronizer 144, which synchronizes the telemetry signals with respect to a uniform time base. For example, to perform these synchronization operations, signal synchronizer 144 can use the technique described in U.S. Pat. No. 8,365,003, entitled "Synchronizing Time Domain Signals in Computing System Using Phase Frequency Slope Value of Cross Power Spectral Density," by inventors Kenny C. Gross, et. al., filed on 19 Dec. 2008 and issued on 29 Jan. 2013. This patent is hereby incorporated by reference in order to disclose details of this technique.

Then, the dequantized and synchronized telemetry signals feed into a signal validator 145, which validates the telemetry signals to ensure the telemetry signals are obtained from properly operating sensors. For example, signal validator 145 can use the technique for validating sensors described in U.S. Pat. No. 7,751,910, entitled "High Accuracy Virtual Sensors for Computer Systems," by inventors Kenny C. Gross, et. al., filed on 16 Apr. 2007 and issued on 6 Jul. 2010. This patent is hereby incorporated by reference in order to disclose details of this technique.

Finally, the dequantized, synchronized and validated telemetry signals feed into an HVAC controller 146 (also called a "CRAC controller"), which controls the operation of fans 135 and CRAC system 149, to minimize the collective energy consumption of the computer system and the cooling system as is described in more detail below. HVAC controller 146 can make use of a number of user-configurable settings 149, and can also generate prognostics alerts 148, which can be fed into a fault-management architecture (not shown).

Thermal telemetry unit 142, fan-speed telemetry unit 141, signal dequantizer 143, signal synchronizer 144 and signal validator 145 can all be implemented through a prognostics system, which is described with reference to FIG. 1B below.

Prognostics System

Figure 1B:
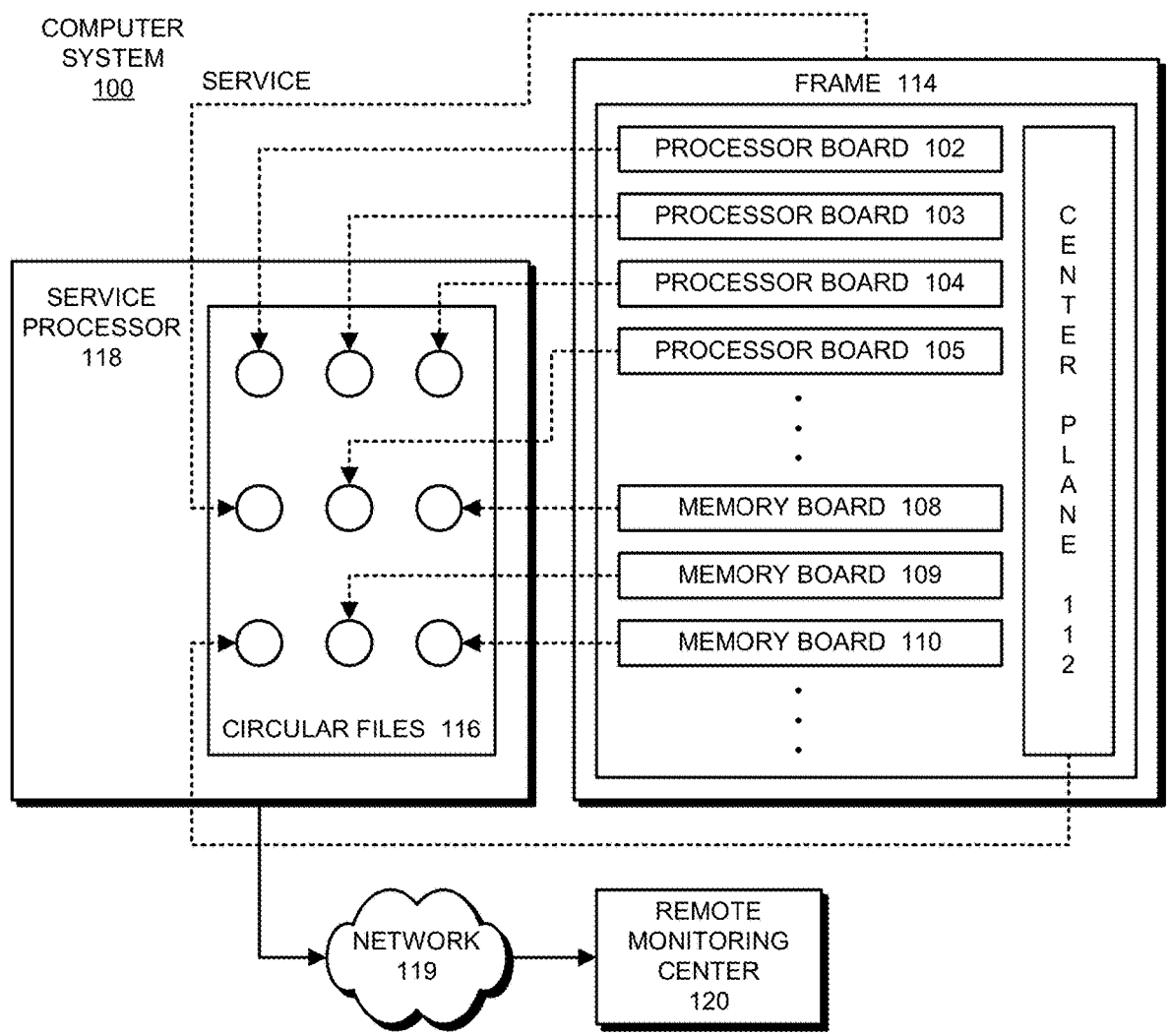
FIG. 1B illustrates a computer system that includes a service processor for processing telemetry signals in accordance with the disclosed embodiments.

FIG. 1B illustrates an exemplary prognostics system that can obtain telemetry data from: an operating system of the computer system, a set of sensors in the computer system, and/or one or more external sensors that reside outside the computer system. As shown in FIG. 1B, a computer system 100 includes a number of processor boards 102-105 and a number of memory boards 108-110, which communicate with each other through center plane 112. These system components are all housed within a frame 114.

In one or more embodiments, these system components and frame 114 are all "field-replaceable units" (FRUs), which are independently monitored as is described below. Note that all major system units, including both hardware and software, can be decomposed into FRUs. For example, a software FRU can include an operating system, a middleware component, a database, and/or an application.

Computer system 100 is associated with a service processor 118, which can be located within computer system 100, or alternatively can be located in a standalone unit separate from computer system 100. For example, service processor 118 may correspond to a portable computing device, such as a mobile phone, laptop computer, personal digital assistant (PDA), and/or portable media player. Service processor 118 may include a monitoring mechanism that performs a number of diagnostic functions for computer system 100. One of these diagnostic functions involves recording performance parameters from the various FRUs within computer system 100 into a set of circular files 116 located within service processor 118. In one embodiment of the present invention, the performance parameters are recorded from telemetry signals generated from hardware sensors and software monitors within computer system 100. (Note that the software monitors that generate telemetry signals are also referred to as "software sensors" or simply sensors within this specification and the appended claims.) In one or more embodiments, a dedicated circular file is created and used for each FRU within computer system 100. Alternatively, a single comprehensive circular file may be created and used to aggregate performance data for all FRUs within computer system 100.

The contents of one or more of these circular files 116 can be transferred across network 119 to remote monitoring center 120 for diagnostic purposes. Network 119 can generally include any type of wired or wireless communication channel capable of coupling together computing nodes. This includes, but is not limited to, a local area network (LAN), a wide area network (WAN), a wireless network, and/or a combination of networks. In one or more embodiments, network 119 includes the Internet. Upon receiving one or more circular files 116, remote monitoring center 120 may perform various diagnostic functions on computer system 100, as described below with respect to FIG. 2. The system of FIG. 1B is described further in U.S. Pat. No. 7,020,802 (issued Mar. 28, 2006), by inventors Kenny C. Gross and Larry G. Votta, Jr., entitled "Method and Apparatus for Monitoring and Recording Computer System Performance Parameters," which is incorporated herein by reference.

Figure 2:
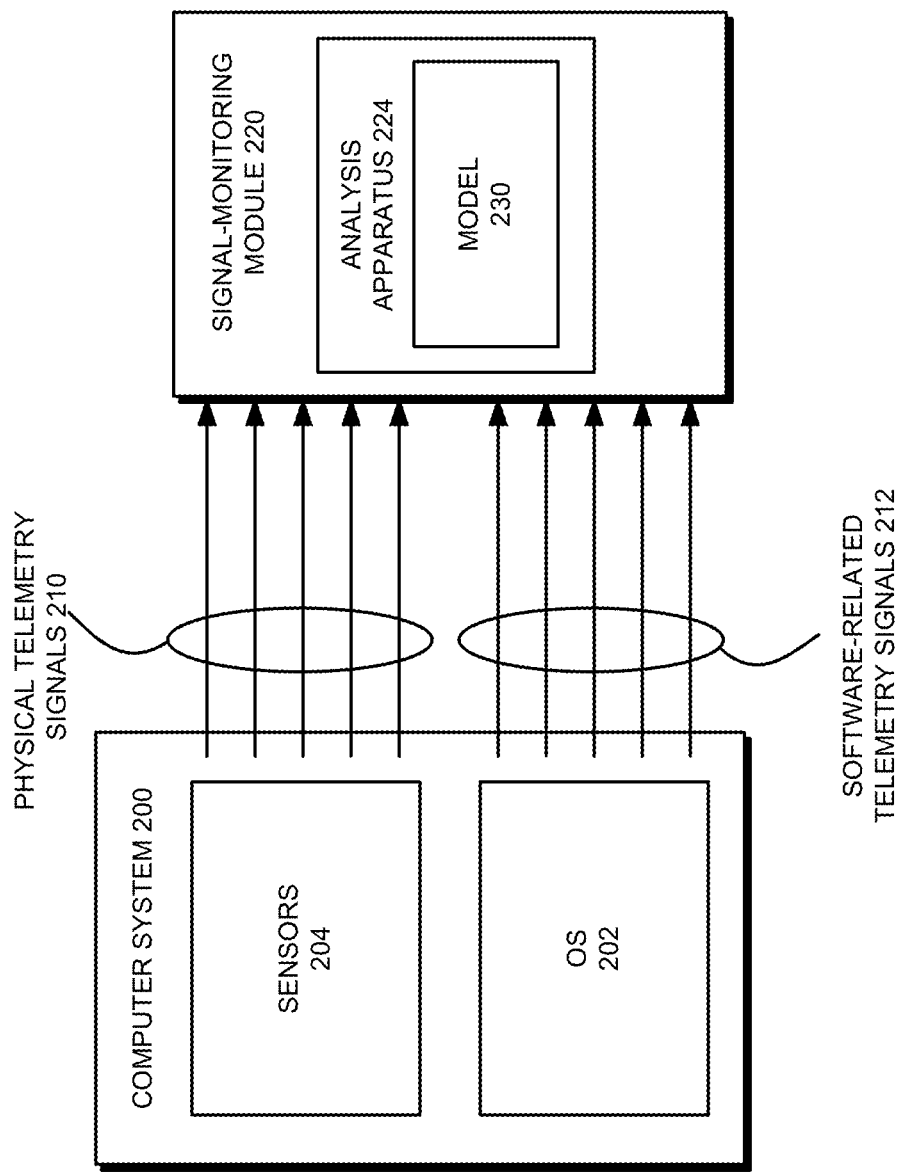
FIG. 2 illustrates a telemetry-analysis system in accordance with the disclosed embodiments.

FIG. 2 shows a telemetry-analysis system that performs prognostic pattern-recognition operations in accordance with an embodiment. In this example, a computer system 200 is monitored using a number of telemetric signals, including physical telemetry signals 210 and software-related telemetry signals 212, which are transmitted to a signal-monitoring module 220. Signal-monitoring module 220 may assess the state of computer system 200 using these telemetry signals 210 and 212. For example, signal-monitoring module 220 may analyze telemetry signals 210 and 212 to detect and manage faults in computer system 200 and/or issue alerts when there is an anomaly or degradation risk in computer system 200.

Signal-monitoring module 220 may be provided by and/or implemented using a service processor associated with computer system 200. Alternatively, signal-monitoring module 220 may reside within a remote monitoring center (e.g., remote monitoring center 120 of FIG. 1B) that obtains telemetry signals 210 and 212 from computer system 200 over a network connection. Moreover, signal-monitoring module 220 may include functionality to analyze both real-time telemetry signals 210 and 212 and long-term historical telemetry data. For example, signal-monitoring module 220 may be used to detect anomalies in telemetry signals 210 and 212 received directly from the monitored computer system(s). Signal-monitoring module 220 may also be used during offline detection of anomalies from the monitored computer system(s) by processing archived and/or compressed telemetry data associated with the monitored computer system(s).

Prior to analyzing telemetry signals 210 and 212, analysis apparatus 224 may aggregate and pre-process telemetry signals 210 and 212. Moreover, during pre-processing of telemetry signals 210 and 212, analysis apparatus 224 may synchronize disparate sampling streams by standardizing timestamps of telemetry signals 210 and 212 from different domains. Next, analysis apparatus 224 may transform telemetry signals 210 and 212 into signals with uniform sampling rates. For example, analysis apparatus 224 may use an analytical re-sampling process (ARP) to up-sample signals with slower sampling rates to match the highest sampling rates in the aggregation of monitored telemetry signals 210 and 212.

In one or more embodiments, the nonlinear, nonparametric regression technique used by analysis apparatus 224 corresponds to a Multivariate State Estimation Technique (MSET). Analysis apparatus 224 may be trained using historical telemetry data from computer system 200 and/or similar computer systems. The historical telemetry data may be used to determine correlations among various telemetry signals 210 and 212 collected from the monitored computer system, wherein the correlations are embodied in a model 230 that can be used to detect incipient anomalies that arise during operation of computer system 200. Note that model 230 can generally include any type of model that can be trained using a nonlinear, nonparametric (NLNP) regression technique. In some embodiments, model 230 is implemented using an MSET model.

Those skilled in the art will appreciate that the nonlinear, nonparametric regression technique used in analysis apparatus 224 may be provided by any number of pattern-recognition techniques. For example, see [Gribok] "Use of Kernel Based Techniques for Sensor Validation in Nuclear Power Plants," by Andrei V. Gribok, J. Wesley Hines, and Robert E. Uhrig, The Third American Nuclear Society International Topical Meeting on Nuclear Plant Instrumentation and Control and Human-Machine Interface Technologies, Washington, D.C., Nov. 13-17, 2000. This paper outlines several different pattern-recognition approaches. Hence, the term "MSET" as used in this specification can refer to (among other things) any of the 25 techniques outlined in Gribok, including Ordinary Least Squares (OLS), Support Vector Machines (SVM), Artificial Neural Networks (ANNs), MSET, or Regularized MSET (RMSET).

Prognostic-Surveillance Mechanism

Figure 3:
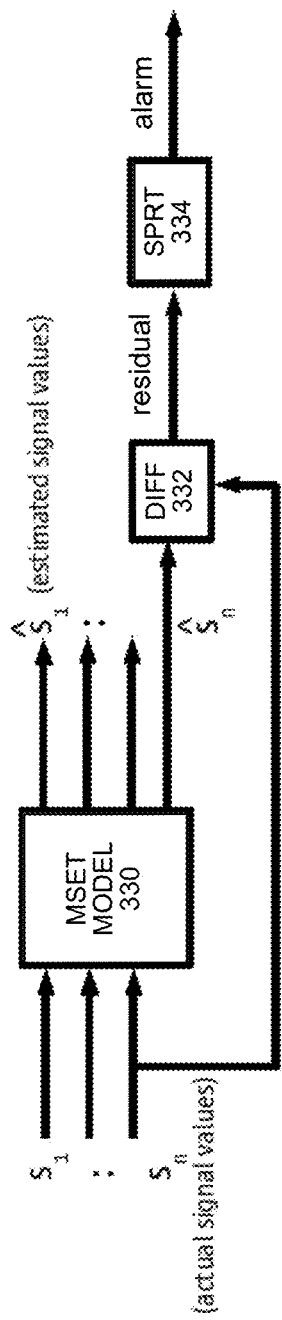
FIG. 3 illustrates a prognostic-surveillance mechanism in accordance with the disclosed embodiments.

FIG. 3 illustrates how a prognostic-surveillance mechanism that uses an MSET model (or another NLNP-regression-based model) operates in accordance with the disclosed embodiments. Referring to FIG. 3, for specific systems, processes, or assets under surveillance, there exist a collection of n time series sensor signals, $S_1, S_2, \ldots, S_n$, that are being monitored. These time series signals feed into an MSET pattern-recognition model 330. Although MSET is used in the disclosed embodiments, the disclosed embodiments can generally use any one of a generic class of pattern-recognition techniques called nonlinear, nonparametric (NLNP) regression, which includes MSET, neural networks, auto-associative kernel regression (AAKR), and even simple linear regression (LR).

In the scheme illustrated in FIG. 3, the MSET model 330 is "trained" to learn patterns of correlation among all of the monitored time series signals $S_1, S_2, \ldots, S_n$. This training process involves a computationally intensive calculation involving data that contains no anomalies. The pattern-recognition system is then placed into a "real-time surveillance mode," wherein the trained MSET model 330 predicts what each signal should be, based on other correlated variables; these are the "estimated signal values" illustrated in FIG. 3. Prognostic fault detection is achieved by using a differencing module 332 to perform a pairwise differencing operation between the actual signal values and the estimated signal values. The system then applies a "detection operation" to the residuals generated by the differencing operation by using a sequential probability ratio test (SPRT) module 334 to detect anomalies and possibly generate an alarm.

Controlling the Cooling System

Figure 4:
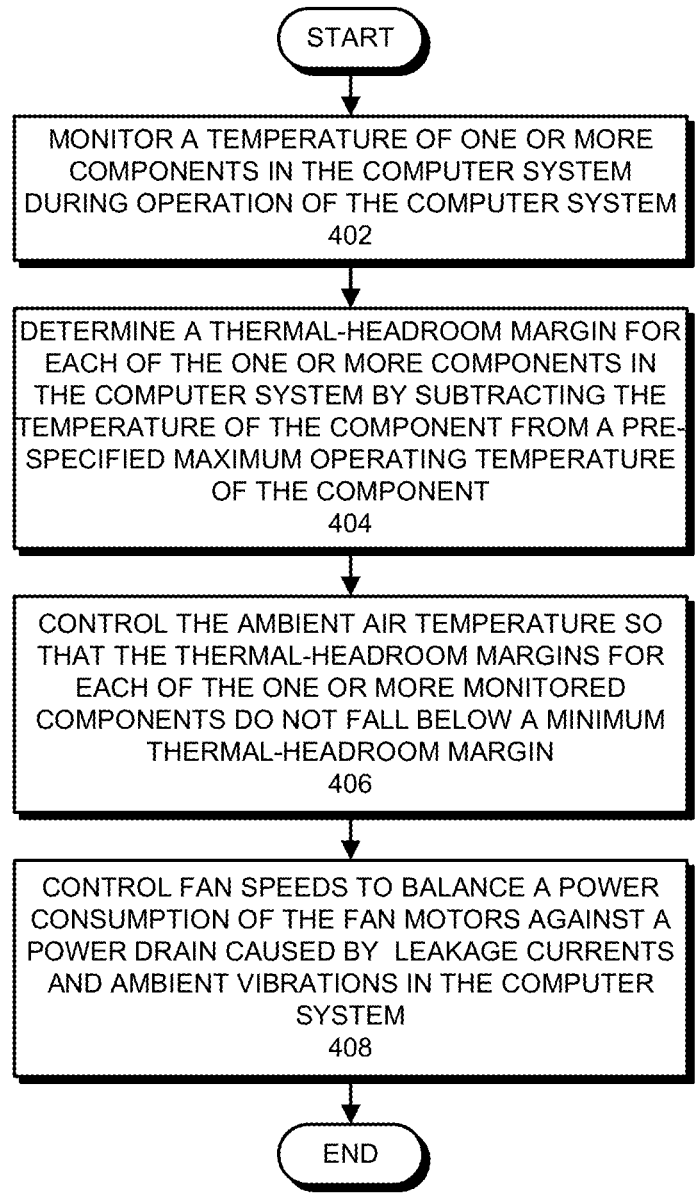
FIG. 4 presents a flowchart illustrating the process of controlling a cooling system in accordance with the disclosed embodiments.

FIG. 4 presents a flowchart illustrating the process of controlling a cooling system in accordance with the disclosed embodiments. During operation, the cooling system monitors a temperature of one or more components in the computer system during operation of the computer system (step 402). Next, the cooling system determines a thermal-headroom margin for each of the one or more components in the computer system by subtracting the temperature of the component from a pre-specified maximum operating temperature of the component (step 404). Then, the cooling system controls the ambient air temperature so that the thermal-headroom margins for each of the one or more monitored components do not fall below a minimum thermal-headroom margin (step 406). The cooling system also controls fan speeds to balance a power consumption of the fan motors against a power drain caused by leakage currents and ambient vibrations in the computer system (step 408).

Figure 5:
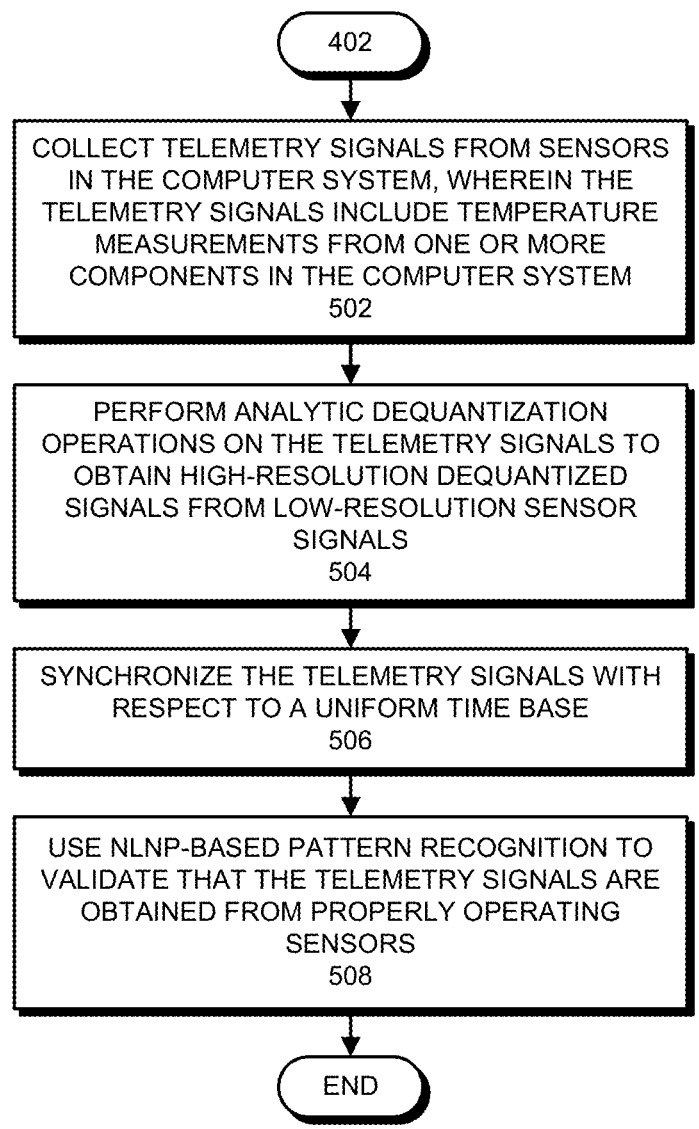
FIG. 5 presents a flowchart illustrating the process of gathering and processing telemetry data for a cooling system in accordance with the disclosed embodiments.

FIG. 5 presents a flowchart illustrating the process of gathering and processing telemetry data for a cooling system in accordance with the disclosed embodiments. (Note that this flowchart illustrates in more detail the operations that take place during step 402 in the flowchart in FIG. 4.) First, the system collects telemetry signals from sensors in the computer system, wherein the telemetry signals include temperature measurements from one or more components in the computer system (step 502). Next, the system performs analytic dequantization operations on the telemetry signals to obtain high-resolution dequantized signals from low-resolution sensor signals (step 504). The system then synchronizes the telemetry signals with respect to a uniform time base (step 506), and validates the telemetry signals to ensure the telemetry signals are obtained from properly operating sensors (step 508).

Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for controlling cooling for one or more computer systems in a data center, comprising:
    monitoring a temperature of one or more components in the computer system during operation of the computer system;
    determining a thermal-headroom margin for each of the one or more components in the computer system by subtracting the temperature of the component from a pre-specified maximum operating temperature of the component; and
    controlling an external HVAC cooling system for the data center that regulates an ambient air temperature for the computer system based on the determined thermal-headroom margins for the one or more components, wherein controlling the cooling system additionally comprises minimizing a collective energy consumption of the computer system and the cooling system by controlling a fan speed of the cooling system to balance a power consumption of the cooling system, which grows nonlinearly with increasing fan speeds, against a power drain from leakage currents in semiconductor chips in the computer system, which grows nonlinearly as decreasing fan speeds cause temperatures of the semiconductor chips to increase, wherein balancing the power consumption additionally comprises balancing a power drain due to ambient vibrations in the computer system, wherein increasing fan speeds cause the ambient vibrations to increase.

2. The method of claim 1, wherein controlling the cooling system based on the thermal-headroom margins comprises controlling the ambient air temperature to ensure that the thermal-headroom margins for each of the one or more monitored components does not fall below a minimum thermal-headroom margin.

3. The method of claim 1, wherein controlling the cooling system includes using a closed-loop control system to control the cooling system to cause temperatures of the one or more components in the computer system to meet a target temperature.

4. The method of claim 1, wherein the cooling system comprises the following:
    an air-conditioning system that controls an ambient air temperature for the computer system; and
    one or more cooling fans in the computer system, which blow the ambient air across the one or more components in the computer system.

5. The method of claim 1, wherein monitoring the temperature of one or more components in the computer system involves collecting telemetry signals from sensors in the computer system, wherein the telemetry signals include temperature measurements from the one or more components.

6. The method of claim 5, wherein the method further comprises processing the telemetry signals by performing the following operations:
    performing analytic dequantization operations on the telemetry signals to obtain high-resolution dequantized signals from low-resolution sensor signals;
    synchronizing the telemetry signals with respect to a uniform time base; and
    validating the telemetry signals to ensure the telemetry signals are obtained from properly operating sensors.

7. The method of claim 1, wherein the one or more monitored components in the computer system include one or more of the following:
    semiconductor chips;
    memory modules;
    I/O cards; and
    power supply components.

8. A non-transitory computer-readable storage medium storing instructions that when executed by a computer cause the computer to perform a method for controlling cooling for one or more computer systems in a data center, the method comprising:
    monitoring a temperature of one or more components in the computer system during operation of the computer system;
    determining a thermal-headroom margin for each of the one or more components in the computer system by subtracting the temperature of the component from a pre-specified maximum operating temperature of the component; and
    controlling an external HVAC cooling system for the data center that regulates an ambient air temperature for the computer system based on the determined thermal-headroom margins for the one or more components, wherein controlling the cooling system additionally comprises minimizing a collective energy consumption of the computer system and the cooling system by controlling a fan speed of the cooling system to balance a power consumption of the cooling system, which grows nonlinearly with increasing fan speeds, against a power drain from leakage currents in semiconductor chips in the computer system, which grows nonlinearly as decreasing fan speeds cause temperatures of the semiconductor chips to increase, wherein balancing the power consumption additionally comprises balancing a power drain due to ambient vibrations in the computer system, wherein increasing fan speeds cause the ambient vibrations to increase.

9. The non-transitory computer-readable storage medium of claim 8, wherein controlling the cooling system based on the thermal-headroom margins comprises controlling the ambient air temperature to ensure that the thermal-headroom margins for each of the one or more monitored components does not fall below a minimum thermal-headroom margin.

10. The non-transitory computer-readable storage medium of claim 8, wherein controlling the cooling system includes using a closed-loop control system to control the cooling system to cause temperatures of the one or more components in the computer system to meet a target temperature.

11. The non-transitory computer-readable storage medium of claim 8, wherein the cooling system comprises the following:
   an air-conditioning system that controls an ambient air temperature for the computer system; and
   one or more cooling fans in the computer system, which blow the ambient air across the one or more components in the computer system.

12. The non-transitory computer-readable storage medium of claim 8, wherein monitoring the temperature of one or more components in the computer system involves collecting telemetry signals from sensors in the computer system, wherein the telemetry signals include temperature measurements from the one or more components.

13. The non-transitory computer-readable storage medium of claim 12, wherein the method further comprises processing the telemetry signals by performing the following operations:
   performing analytic dequantization operations on the telemetry signals to obtain high-resolution dequantized signals from low-resolution sensor signals;
   synchronizing the telemetry signals with respect to a uniform time base; and
   validating the telemetry signals to ensure the telemetry signals are obtained from properly operating sensors.

14. A system that controls cooling for one or more computer systems in a data center, comprising:
   a controller that,
      monitors a temperature of one or more components in the computer system during operation of the computer system;
      determines a thermal-headroom margin for each of the one or more components in the computer system by subtracting the temperature of the component from a pre-specified maximum operating temperature of the component; and
   controls an external HVAC cooling system for the data center that regulates an ambient air temperature for the computer system based on the determined thermal-headroom margins for the one or more components, wherein controlling the cooling system additionally comprises minimizing a collective energy consumption of the computer system and the cooling system by controlling a fan speed of the cooling system to balance a power consumption of the cooling system, which grows nonlinearly with increasing fan speeds, against a power drain from leakage currents in semiconductor chips in the computer system, which grows nonlinearly as decreasing fan speeds cause temperatures of the semiconductor chips to increase, wherein balancing the power consumption additionally comprises balancing a power drain due to ambient vibrations in the computer system, wherein increasing fan speeds cause the ambient vibrations to increase.

* * * * *